United States Patent
Schmidt et al.

(10) Patent No.: US 10,539,275 B2
(45) Date of Patent: Jan. 21, 2020

(54) LED PHOSPHOR COMPRISING BOW-TIE SHAPED $A_2N_6$ BUILDING BLOCKS

(71) Applicant: KONINKLIJKE PHILIPS N.V., Eindhoven (NL)

(72) Inventors: Peter Josef Schmidt, Aachen (DE); Philipp-Jean Strobel, Aachen (DE); Sebastian Florian Schmiechen, Aachen (DE); Cora Sieglinde Hecht, Aachen (DE); Volker Weiler, Aachen (DE); Wolfgang Schnick, Aachen (DE)

(73) Assignee: Koninklijke Philips N.V. (NL)

( * ) Notice: Subject to any disclaimer, the term of this patent is extended or adjusted under 35 U.S.C. 154(b) by 325 days.

(21) Appl. No.: 15/526,519

(22) PCT Filed: Nov. 5, 2015

(86) PCT No.: PCT/EP2015/075788
§ 371 (c)(1),
(2) Date: May 12, 2017

(87) PCT Pub. No.: WO2016/075021
PCT Pub. Date: May 19, 2016

(65) Prior Publication Data
US 2017/0314745 A1    Nov. 2, 2017

(30) Foreign Application Priority Data

Nov. 14, 2014  (EP) .................................. 14193187

(51) Int. Cl.

| | |
|---|---|
| *F21K 9/64* | (2016.01) |
| *F21V 9/30* | (2018.01) |
| *C09K 11/77* | (2006.01) |
| *C01F 17/00* | (2006.01) |
| *H01L 33/50* | (2010.01) |
| *F21Y 115/10* | (2016.01) |
| *C09K 11/08* | (2006.01) |

(52) U.S. Cl.
CPC ............ *F21K 9/64* (2016.08); *C01F 17/0012* (2013.01); *C09K 11/7734* (2013.01); *F21V 9/30* (2018.02); *C01P 2002/85* (2013.01); *C09K 11/0883* (2013.01); *F21Y 2115/10* (2016.08); *H01L 33/502* (2013.01); *H01L 33/507* (2013.01)

(58) Field of Classification Search
CPC . H01L 33/502; H01L 33/504; C09K 11/7734; C09K 11/7721
See application file for complete search history.

(56) References Cited

U.S. PATENT DOCUMENTS

| | | |
|---|---|---|
| 8,153,025 B2 | 4/2012 | Schmidt et al. |
| 2007/0114548 A1 | 5/2007 | Setlur et al. |
| 2012/0146079 A1 | 6/2012 | Baumann et al. |
| 2013/0127333 A1 | 5/2013 | Jia et al. |
| 2013/0207146 A1 | 8/2013 | Yoshimura et al. |

FOREIGN PATENT DOCUMENTS

CN         101781558 A      7/2010

OTHER PUBLICATIONS

EPO as ISA, "International Search Report and Written Opinion" dated Dec. 3, 2015 from International Application No. PCT/EP2015/075788, filed Nov. 5, 2015, 10 pages.
Extended European Search Report dated Jun. 3, 2015, European Application No. 14193187.3, 4 pages.
Watanabe, et al., "Synthesis of Sr0.99Eu0.01AlSiN3 from intermetallic precursor", Journal of the Ceramic Society of Japan 117 (2009), pp. 115-119.
Avci, et al., "Microencapsulation of Moisture-Sensitive CaS:Eu2+ Particles with aluminum Oxide", J. Electrochem Soc. (2009), 156, pp. J333-J337.
Sho, et al., "Control of AlPO4-nanoparticle coating on LiCoO2 by using water or ethanol", Electrochimica Acta 50 (2005), pp. 4182-4187.
Li, et al, "Low-Temperature Crystallization of Eu-Doped Red-Emitting CaAlSiN3 from Alloy-Derived Ammonometallates", Chemistry of Materials 19 (2007) 3592-3594.
Zuener, et al, "Li2CaSi2N4 and Li2SrSi2N4—A Synthetic Approach to Three-Dimensional Lithium Nitridosilicates", European Journal of Inorganic Chemistry (2010) 4945-4951.
Henderson, et al., "Optical Spectroscopy of Inorganic Solids—Chapter 5—Electronic centres in a vibrating crystalline environment", Clarendon Press—Oxford, 1989, pp. 183-257.

*Primary Examiner* — C Melissa Koslow

(57) ABSTRACT

The invention provides, amongst others for application in a lighting unit, a phosphor selected from the class of $$M_2D_2C_{2-2b}B_bA_2N_6{:}Ln \qquad (I)$$

with
M=selected from the group consisting of divalent Ca, Sr, and Ba;
D=selected from the group consisting of monovalent Li, divalent Mg, Mn, Zn, Cd, and trivalent Al and Ga;
C=selected from the group consisting of monovalent Li and Cu;
B=selected from the group consisting of divalent Mg, Zn, Mn and Cd;
A=selected from the group consisting of tetravalent Si, Ge, Ti, and Hf;
Ln=selected from the group consisting of ES and RE;
ES=selected from the group consisting of divalent Eu, Sm and Yb;
RE=selected from the group consisting of trivalent Ce, Pr, Nd, Sm, Eu, Gd, Tb, Dy, Ho, Er, and Tm; and
$0 \le b \le 1$.

20 Claims, 5 Drawing Sheets

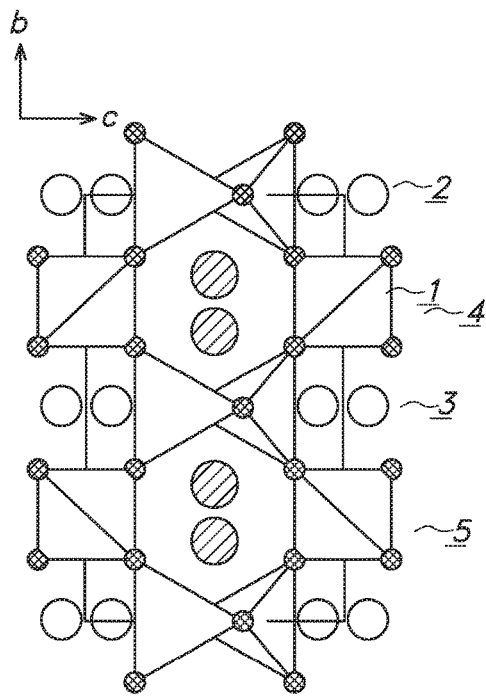
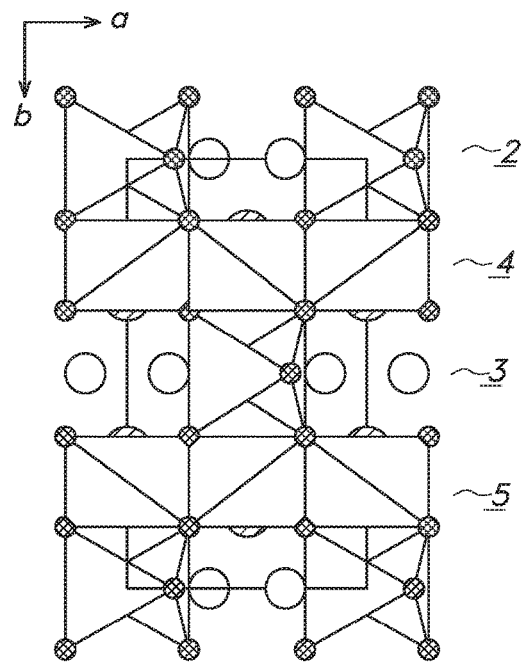
FIG. 2A　　　　　FIG. 2B
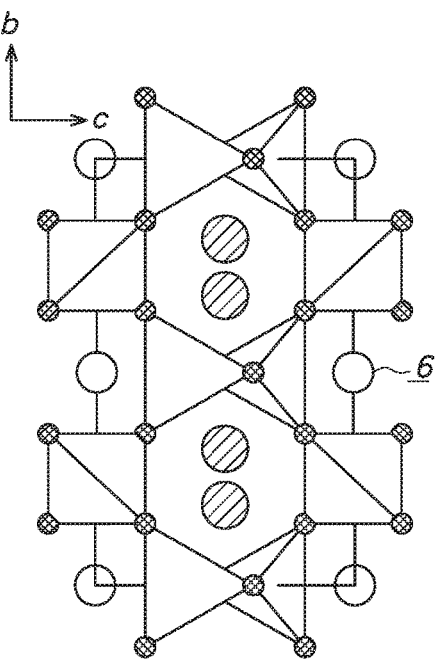
FIG. 3

LED PHOSPHOR COMPRISING BOW-TIE SHAPED $A_2N_6$ BUILDING BLOCKS

CROSS-REFERENCE TO RELATED APPLICATIONS

The present application is a § 371 application of International Application No. PCT/EP2015/075788 filed on Nov. 5, 2015 and entitled "LED PHOSPHOR COMPRISING BOW-TIE SHAPED A2N6 BUILDING BLOCKS", which claims the benefit of European Patent Application No. 14193187.3 filed on Nov. 14, 2014. International Application No. PCT/EP2015/075788 and European Patent Application No. 14193187.3 are incorporated herein.

FIELD OF THE INVENTION

The invention relates to a class of new phosphors, as well as individual members thereof, and to a lighting unit comprising one or more of such phosphors, and optionally one or more other phosphors, for generating luminescence.

BACKGROUND OF THE INVENTION

Red luminescent materials for LED (light emitting device) applications are known in the art. U.S. Pat. No. 8,153,025, for instance, describes a red light emitting material of the formula $M_{1-y}A_{1+x}Si_{4-x}N_{7-x-2y}O_{x+2y}$:RE whereby M is selected out of the group comprising Ba, Sr, Ca, Mg or mixtures thereof, A is selected out of the group comprising Al, Ga, B or mixtures thereof, RE is selected out of the group comprising rare earth metals, Y, La, Sc or mixtures thereof and x is ≥0 and ≤1 and y is ≥0 and ≤0.2. This material is believed to crystallize in a structure type that comprises two individual lattice sites for rare earth metal incorporation, which leads to an improved lighting behavior.

SUMMARY OF THE INVENTION

There is still a need for obtaining good inorganic luminescent materials that can replace or supplement existing luminescent materials, such as for solid state lighting, for instance because of better efficiency or other advantageous luminescent properties like excitation and/or emission band position and/or emission band width. The luminous efficacy of illumination grade white phosphor converted (pc) LEDs is currently limited by the spectral width of the emission band of the red emitting phosphor component.

Hence, it is an aspect of the invention to provide an alternative phosphor, especially an alternative red phosphor and/or optionally a yellow and/or a green phosphor, which preferably further at least partly obviates one or more of above-described drawbacks, which preferably absorbs well in the blue and/or UV (and/or green and/or yellow light), especially in the blue, and/or which efficiently converts the absorbed light into visible light, especially red light (and/or green and/or yellow light). However, other colors (in the visible) may be of interest as well, like cyan or orange. It is further an aspect to provide an alternative lighting unit, configured to use such alternative (red) phosphor (for instance as luminescent material, optionally in combination with other phosphors).

In a first aspect, the invention provides a lighting unit comprising a light source configured to generate light source light (especially one or more of UV and blue) and a luminescent material configured to convert at least part of the light source light into luminescent material light, wherein the light source comprises a light emitting diode (LED), or optionally (or additionally) another (solid state) light source, and wherein the luminescent material comprises a phosphor selected from the class of $$M_2D_2C_{2-2b}B_bA_2N_6:Ln \qquad (I)$$

with
M=selected from the group consisting of divalent Ca, Sr, and Ba;
D=selected from the group consisting of monovalent Li, divalent Mg, Mn, Zn, Cd, and trivalent Al and Ga;
C=selected from the group consisting of monovalent Li and Cu;
B=selected from the group consisting of divalent Mg, Zn, Mn and Cd;
A=selected from the group consisting of tetravalent Si, Ge, Ti, and Hf;
Ln=selected from the group consisting of ES and RE;
ES=selected from the group consisting of divalent Eu, Sm and Yb;
RE=selected from the group consisting of trivalent Ce, Pr, Nd, Sm, Eu, Gd, Tb, Dy, Ho, Er, and Tm; and
0≤b≤1. Note that N symbolizes nitrogen.

The phosphor, when illuminated by the light source light thus converts at least part of the light source light into luminescent material light (emission). The luminescent material light thus contains luminescence from the phosphor (with formula (I)), and optionally of other phosphors (see also below).

In a second aspect, the invention also provides such phosphor per se, i.e. a phosphor selected from the class of $$M_2D_2C_{2-2b}B_bA_2N_6:Ln \qquad (I)$$

with
M=selected from the group consisting of divalent Ca, Sr, and Ba;
D=selected from the group consisting of monovalent Li, divalent Mg, Mn, Zn, Cd, and trivalent Al and Ga;
C=selected from the group consisting of monovalent Li and Cu;
B=selected from the group consisting of divalent Mg, Zn, Mn and Cd;
A=selected from the group consisting of tetravalent Si, Ge, Ti, and Hf;
Ln=selected from the group consisting of ES and RE;
ES=selected from the group consisting of divalent Eu, Sm and Yb;
RE=selected from the group consisting of trivalent Ce, Pr, Nd, Sm, Eu, Gd, Tb, Dy, Ho, Er, and Tm; and
0≤b≤1.

It appears that such phosphor may, e.g. in the case of divalent europium (Eu; i.e. $Eu^{2+}$) as dopant, have an emission with a maximum in the wavelength range of 620-650 which allows light with a very high CRI (color rendering index). Further, this emission has a relative narrow full width at half maximum (FWHM) of only in the order of 60 nm. Hence, the present invention provides phosphors, such as red phosphors, which may have a substantial enhanced conversion efficacy. Further, even non-optimized samples have already relative high quantum efficiencies.

Hence, the present invention solves the issues of prior art red emitting LED phosphors by the surprising finding of the phosphor compositions that are especially characterized by formulas $M_2D_2C_{2-2b}B_bA_2N_6$:Ln. These type of phosphors have specific structure elements such as $A_2N_6$ bow-tie shaped double tetrahedra units and $DN_{4/2}$ tetrahedra chains. It is believed that the combination of these structural motifs to form a host lattice network structure leads to surprising properties such as a combination of low local phonon frequencies and e.g. a high Debye temperature of the lattice. As an example $Ca_2Mg_2Li_2Si_2N_6$:Eu in the monoclinic space group C2/m (no. 12), the crystallographic information is summarized in Table 1. For this example M=Ca, D=Mg, C=Li, A=Si, and b=0. Atomic coordinates and isotropic displacement parameters are given in Table 2. Selected bond lengths are listed in Table 3.

TABLE 1

Crystallographic data of $Ca_2Mg_2Li_2Si_2N_6$

| | |
|---|---|
| formula mass/g · mol$^{-1}$ | 141.45 |
| crystal system | monoclinic |
| space group | C2/m (no. 12) |
| cell parameters/Å | a = 5.5472(11) |
| | b = 9.844(2) |
| | c = 5.9978(12) |
| | β = 97.13(3) |
| V/Å$^3$ | 325.00(11) |
| formula units/cell | 4 |
| X-ray density/g · cm$^{-3}$ | 2.891 |
| abs. coefficient μ/mm$^{-1}$ | 2.247 |

TABLE 2

Atomic coordinates and equivalent isotropic displacement parameters of $Ca_2Mg_2Li_2Si_2N_6{}^a$

| Atom | Wyckoff position | x | y | z | $U_{eq}$/Å$^3$ |
|---|---|---|---|---|---|
| Ca | 4h | 0.0000 | 0.31597(7) | 0.5000 | 0.00949(19) |
| Si | 4i | 0.13076(15) | 0.0000 | 0.67901(14) | 0.0084(2) |
| Mg | 4g | 0.0000 | 0.23392(12) | 0.0000 | 0.0106(3) |
| Li | 4i | 0.1710(13) | 0.5000 | 0.9044(10) | 0.0198(13) |
| N1 | 4i | −0.1912(5) | 0.0000 | 0.6098(4) | 0.0112(5) |
| N2 | 8j | 0.2523(4) | 0.3548(2) | 0.1895(3) | 0.0130(4) |

$^a$e.s.d.'s (Estimated Standard Deviations) in parentheses

TABLE 3

Selected bond lengths (Å) of $Ca_2Mg_2Li_2Si_2N_6{}^a$

| bond name | |
|---|---|
| Ca—N(1) | 2.524(2) × 2 |
| Ca—N(2) | 2.494(2) × 2 |
| Ca—N(2) | 2.747(2) × 2 |
| Si—N(1) | 1.783(3) |
| Si—N(1) | 1.805(3) |
| Si—(N2) | 1.721(2) × 2 |
| Mg—N(2) | 2.067(2) × 2 |
| Mg—N(2) | 2.081(2) × 2 |
| Li—N(1) | 2.010(7) |
| Li—N(2) | 2.232(5) × 2 |

$^a$e.s.d.'s in parentheses

Edge sharing of the [$SiN_4$] tetrahedra to form [$Si_2N_6$]$^{10-}$ bow-tie units in $Ca_2Mg_2Li_2Si_2N_6$ induces a distorted tetrahedral angle of 94.40(13)° for N1-Si—N1. This effects an increased Si—N1 bond length of 1.805(3) Å and therefore a shorter Si—Si distance of 2.4378(18) Å. The bonds to terminal N atoms range from 1.72 to 1.78 Å. Chemically the invented materials with $Ca_2Mg_2Li_2Si_2N_6$ as one member can be classified as magnesonitridosilicates and hence [$Si_2N_6$]$^{10-}$ bow-tie units are connected by [$MgN_4$] tetrahedra. These are connected via two common edges to each other forming strands running along [100] (see FIG. 2). Mg—N bond lengths range from 2.07-2.08 Å and are in good accordance with the sum of the ionic radii according to Baur and the one found in $MgSiN_2$. Ca is in a sixfold nitrogen coordination with Ca—N distances of 2.49 to 2.75 Å. [$CaN_6$] octahedrons are connected via two common edges to each other forming sechser ring layers along [001]. A sechser ring is a ring of six atoms. The net of Ca atoms in the (110) plane only shows a slight deviation from a hexagonal arrangement (a*√3/b=0.976). Li is in a, for a nitridic surrounding, uncommon threefold coordination. An extended view of the coordination sphere of the Li site leads to a 3+2 coordination, resulting in a short Li—Li distance of 2.336(13) Å. The resulting coordination polyhedron around both Li atoms can be described as a barely distorted octahedron. These isolated octahedrons connect the layers of sechser rings formed by [$CaN_6$] octahedrons.

According to the formula $M_2D_2C_{2-2b}B_bA_2N_6$ a fraction or all monovalent C atoms can be substituted by divalent B atoms (b>0) (FIG. 3). In this case, two C atoms located at Wycoff site 4i (see table 2) that are coordinated threefold by N atoms may be replaced by one B atom located at Wycoff site 2b (2/m site symmetry) with square planar coordination by four N atoms (FIG. 4). If all monovalent C atoms in the host lattice skeleton are e.g. being replaced by divalent B atoms, more simpler compositions can be obtained. As example, all Li in $Ca_2Mg_2Li_2Si_2N_6$:Eu can be replaced by Mg to form $Ca_2Mg_3Si_2N_6$:Eu. The replacement reduces the number of different starting compounds needed and thus makes process control easier. Especially b<1, even more especially b<0.5, and yet even more especially b is 0.

Divalent D atoms such as Mg(II) or Zn(II) that are center atoms of the edge connected tetrahedra chains $DN_{4/2}$ running along crystallographic an axis can be replaced by other atoms. For example, 2 Mg(II) atoms can be replaced by 1 Li(I)+1 Al(III) atom. Such a replacement increases the acidity of the N2 atoms that coordinate the rare earth activator Eu(II) or Ce(III) in the luminescent material and lead to a blue shift of absorption and emission transitions. Examples for materials that show a full replacement of the divalent D atoms by monovalent and trivalent atoms are e.g. $Ca_2AlLi_3Si_2N_6$:Eu or $Ca_{1.8}Sr_{0.2}GaLi_3Si_2N_6$:Eu.

Substitution of M=Ca by Sr to form mixed crystals leads to an increase of the cell volume and lengthening of the activator—N ligand contacts. The reduced ligand field strength leads to a blue shift of absorption and emission bands. Table 4 compares lattice constants of single crystals with 0% and 7% Sr substituted for Ca.

TABLE 4

Cell constants of $Ca_{2-n}Sr_nMg_2Li_2Si_2N_6$ (n = 0, 0.07)

| | n = | |
|---|---|---|
| | 0 | 0.07 |
| cell parameters/Å | a = 5.5596 | a = 5.5744 |
| | b = 9.833 | b = 9.8439 |
| | c = 6.0085 | c = 6.0170 |
| | β = 97.22° | β = 97.252° |

While doping of the M site with Eu(II) leads to emission in the red spectral range doping with Ce(III) leads to emission in the green to yellow spectral range. These relations of emission colors are known from other known phosphors like CaS:Eu$^{2+}$ showing emission at ~650 nm and CaS:Ce$^{3+}$ showing emission at ~505 nm. If the emission band position of a Eu(II) phosphor is known, the band position of Ce(III) in the same host lattice can be predicted quite accurately.

The invention also relates to a luminescent material at least comprising this phosphor and optionally one or more other materials, like one or more other phosphors and/or one or more other phases (like (remaining) flux material. The phosphor may also include impurities, like one or more of halogen impurities and metal impurities. The luminescent material, may next to the one or more phosphors as defined herein, also include other phases, like one or more of the—already indicated (remaining)—flux material, remaining starting material(s) and one or more phases that are also formed during synthesis of the one or more (respective) phosphors.

Likewise, the phosphor may also include other phases, like one or more of the —already indicated (remaining)— flux material, remaining starting material(s) and one or more phases that are also formed during synthesis of the one or more (respective) phosphors. In general, the weight percentage of such other phase(s) will be below about 10 wt. % (relative to the total weight of the phosphor.

As indicated above, the phosphor may also include impurities. This is known in the art. Hence, in embodiments chemical formulas like $M_2D_2C_{2-2b}B_bA_2N_6$:Ln, do not exclude the presence of impurities, for instance up to a total of about 500 ppm, especially up to about 200 ppm, even more especially up to about 100 ppm. Hence, even though the chemical formula does not indicate the presence of impurities, impurities that may (nevertheless) be present can for instance be selected from the group consisting of Li, Na, K, Sc, Y, Ti, Zr, V, Nb, Cr, Mo, Mn, Fe, Ru, Co, Rh, Ni, Pd, Cu, Zn, V, C, N, O, F, Al, Si, P, S, Cl, Ga, Ge, Se, Br, Lu, La, Ce, Pr, Nd, Sm, Eu, Gd, Tb, Dy, Ho, Er, Tm, Yb, Hf, Ta, W, Re, Os, Ir, Pt, Tl, Pb, and Bi. Here, impurities are listed. When for instance the chemical formula indicates the availability of Li or Eu, these are—even when available in small amounts—not considered as impurities. Hence, e.g. in $Ca_2Mg_3Si_2N_6$:Eu, Eu is not an impurity, but $Ca_2Mg_3Si_2N_6$:Eu may include e.g. 150 ppm Hf or Na or Mg (as impurity/impurities).

Further, the luminescent material may include one or more of scattering particles and a halide salt.

Requirements for a red phosphor component in a white LED may be that a color rendering of Ra8>90 is obtained and that (optionally in combination with other phosphors) a correlated color temperature in the 2500-5000 K range can be obtained. The red phosphor component should especially show an emission peak in the 605-655 nm wavelength range with a full-width-half-maximum (FWHM) less than 80 nm. Requirements for a red phosphor component in a white LED may be that in a display backlighting configuration a color gamut of >90% of the NTSC standard is obtained and that (optionally in combination with other phosphors) a correlated color temperature in the 7000-11000 K range can be obtained. Ideally, the red phosphor component should show an emission peak in the 630-655 nm wavelength range with a full-width-half-maximum (FWHM) less than 80 nm. As indicated above, this FWHM condition can easily be met with the present phosphor (when based e.g. on $Eu^{2+}$).

However, as indicated above, also phosphors having other characteristics may be of interest.

The term "class" herein especially refers to a group of materials that have the same crystallographic structure or related structures. At least, the group of materials may all have the same formula I. The materials may further all have the bow-tie $A_2N_6$ building blocks and the $BN_4$ and/or $C_2N_6$ groups, and the $DN_4$ tetrahedra that may form $DN_{4/2}$ chains. At least a number of the family members within the class, especially in general those defined by $(Sr,Ca)_2Mg_2Li_2Si_2N_6$:Ln, are of the monoclinic crystal system and belong to the space group C2/m (no. 12)(see also above). Further, the term "class" may also include partial substitutions of cations and/or anions, especially when the structural motif is being maintained. For instance, in some of the above-mentioned classes Si—N may partially be replaced by Al—O.

In an embodiment, the term "phosphor" may relate to a combination of different phosphors all complying with formula (I). The term "formula (I)" may also be indicated as "chemical formula (I)". Hence, the luminescent material at least comprises one or more phosphors having the chemical formula (I) and optionally one or more other phosphors not having this chemical formula (I) (such as e.g. $Y_3Al_5O_{12}$:$Ce^{3+}$ and/or $Sr_2Si_5N_8$:$Eu^{2+}$).

The novel phosphors can be made with solid state synthesis methods. Synthesis of the claimed materials can e.g. be carried out by a variety of processing methods. It has been found that keeping firing temperatures low (below ~1500° C., such as below 1400° C.) may improve phase purity and luminescence properties of the claimed phases. Hence, the invention also relates to a solid state nitride synthesis method performed at a temperature below 1400° C., and the phosphors of formula (I) obtainable by such synthesis method. It turned out that reactive precursors like intermetallic phases obtained by melting of two or more of the constituent M, D, C, B, and A metals, alkaline earth amides, or silicon diimide are especially suitable. The addition of flux materials like fluorides or chlorides, especially at least fluorides, may also improve phase formation. Although not explicitly accounted for in the given formulas part of the added halide flux may remain within the phosphor after firing without deteriorating its luminescence properties. The same holds for other impurities like carbon that may to some extend be incorporated into the lattice on nitrogen lattice sites during reactions in e.g. a graphite furnace or by application of a carbon reduction and nitridation (CRN) reaction method. Suitable synthesis methods comprise (a) high pressure nitridation, (b) processing in alkaline metal melts, (c) ammonothermal synthesis and (d) standard mix and fire approaches. In a specific embodiment, one or more of the starting materials comprise hydrides (such as $SrH_2$), and optionally as synthesis method hot isostatic pressing (HIP) is applied. In yet a specific embodiment, one or more of the starting materials comprise hydrides (such as $SrH_2$), and a surplus of earth alkali metal is applied in the form of alkali metal fluoride (such as $SrF_2$), and optionally as synthesis method hot isostatic pressing (HIP) is applied.

Such synthesis methods are known in the art, and are for instance described in Watanabe, et al, Synthesis of $Sr_{0.99}Eu_{0.01}AlSiN_3$ from intermetallic precursor, Journal of the Ceramic Society of Japan 117 (2009) 115-119; Zeuner et al, $Li_2CaSi_2N_4$ and $Li_2SrSi_2N_4$-a Synthetic Approach to Three-Dimensional Lithium Nitridosilicates European Journal of Inorganic Chemistry (2010) 4945-495; and Li et al, Low-Temperature Crystallization of Eu-Doped Red-Emitting $CaAlSiN_3$ from Alloy-Derived Ammonometallates, Chemistry of Materials 19 (2007) 3592-3594.

Hence, in yet a further aspect the invention provides a method for making the phosphor as defined herein, wherein the method comprises combining starting materials selected to obtain the phosphor and heating these at a temperature in the range of 800-1300° C. As indicated herein, especially Ln comprises one or more of Eu and Ce, and the heating is performed in a reducing atmosphere, such as especially including $H_2$. Also when other lanthanides are applied, the heating may be executed in a reducing atmosphere, especially when intermetallic precursors are applied. The intermetallic precursor may especially include at least M. Further, the intermetallic precursor may especially also comprise at least D. Yet further, the intermetallic precursor may also comprise one or more of C, A and Ln, especially at least one or more of A and Ln.

Codoping of alkaline metal containing phosphors may also be an embodiment of this invention. Doping with both Ce(III) and Eu(II) may lead to phosphors with efficient red emission and reduced self-absorption of the Eu(II) emission due to low Eu concentrations. An example of such a material is e.g. $(Ca_{0.9}Sr_{0.1})_{1.976}Li_3AlSi_2N_6:Ce_{0.02},Eu_{0.004}$ (here, y=0.01; and x=0.002; i.e. $(Ca_{0.9}Sr_{0.1})_{1.976}Eu_{0.004}Ce_{0.02}Li_3AlSi_2N_6$; see also below; note that in this example M=Ca,Sr; D=Li, C=Li and Al, b=0 and A=Si).

It is believed that $Eu^{2+}$ or other rare earth cations, like $Ce^{3+}$, is incorporated onto M lattice sites that are coordinated by six N atoms For $Eu^{2-}$, or other divalent lanthanide ions, partially replacing M, charge compensation is not necessary. However, when introducing trivalent ions, such as $Ce^{3+}$, charge compensation may be necessary. For instance 2 SE may replace a M and e.g. a Li or Cu. Here, for the sake of simplicity, the charge compensation is not included in the following more detailed formula:

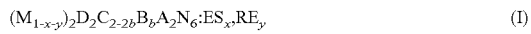

$$(M_{1-x-y})_2D_2C_{2-2b}B_bA_2N_6:ES_x,RE_y \quad (I)$$

Here, 0≤x≤0.2, 0≤y≤0.2, and 0<x+y≤0.4; and b as defined above. This formula may also be rewritten as $(M_{1-x-y})_2ES_xRE_yD_2C_{2-2b}B_bA_2N_6$ (in this formula, when y>0, charge compensation have to be included; see also above).

Assuming ES to be samarium and europium (and optionally also (divalent) ytterbium), the value for x is still as herein indicated, but is the summation of the individual species. Likewise, this applies to all other elementary species indicated in the formula. Hence, an example of formula (I) may for instance be: $Ca_{1.99}Mg_2Li_2Si_2N_6:Eu_{0.01}$ (i.e. x=0.005) $(Ca_{0.8}Sr_{0.2})_{1.99}Mg_2Li_2Si_2N_6:Eu_{0.01}$ (i.e. x=0.005), $Ca_{1.84}Sr_{0.14}Mg_2Li_2Si_2N_6:Eu_{0.02}$ (i.e. x=0.01), etc.. Note that in the general formula x*100 and y*100 indicate the % of M that is replaced by ES and/or RE respectively. For instance, when x is 0.01, then the formula is $M_{1.98}Eu_{0.02}Mg_2Li_2Si_2N_6$. This can also be indicated as $M_2Mg_2Li_2Si_2N_6:Eu_{0.01}$ or as $(M)_{1.98}Mg_2Li_2Si_2N_6:Eu_{0.02}$. All these three indications indicate x=0.01, i.e. 1% of all M ions is replaced by Eu.

Divalent and trivalent samarium and/or divalent and trivalent europium may be present depending upon e.g. the (reducing) conditions during synthesis. As luminescent ions preferably RE and ES consist of (a) $Eu^{2+}$ (i.e. no RE, and no Sm) or (b) $Ce^{3+}$ (i.e. no ES, and no other RE) or (c) $Eu^{2+}$ and $Ce^{3+}$ (i.e. no Sm and no other RE). Hence, in embodiment (a), the molar ratio between the sum of the other all optional ES and RE on the one hand, and Eu on the other hand ((Sm(II)+RE)/Eu)<0.1, especially <0.01, even more <0.0001; in embodiment (b), the molar ratio between the sum of the other all optional ES and RE on the one hand, and Ce on the other hand ((ES+RE)/Ce)<0.1, especially <0.01, even more <0.0001; and in embodiment (b), the molar ratio between the sum of the other all optional ES and RE on the one hand, and Eu(II) and Ce on the other hand ((ES+RE)/(Ce+Eu(II))<0.1, especially <0.01, even more <0.0001. Would also Yb(II) be available, ((Sm(II)+RE)/Eu) may be redefined as ((Sm(II)+Yb(II)+RE)/Eu), with ((Sm(II)+Yb(II)+RE)/Eu))<0.1, especially <0.01, even more <0.0001. Reducing conditions may especially include an atmosphere comprising $H_2$.

Especially, as divalent luminescent species only one or more of Sm and Eu are chosen, especially substantially only Eu.

In another embodiment, as RE Ce and Pr are applied (especially in the absence of Sm and Eu); Pr may provide a(n additional) red luminescence. Trivalent cerium may be used to provide a yellow and/or green emitter, and/or to sensitize divalent europium (in the case both Ce and Eu are present). The species ES and RE are herein also indicated as dopants.

When ES is available and RE is available, in an embodiment y/x is preferably <0.1, especially<0.01, in case RE≠Ce. This implies that when divalent Eu and/or Sm are applied, optional trivalent lanthanides RE are present in a molar amount that is less than 10% of the molar amount of Eu and/or Sm, respectively, in case where the optional trivalent lanthanide is not cerium. In a specific embodiment, x>0, and y=0; e.g. ES is substantially exclusively europium, like as dopant divalent europium is present, and all other potentially luminescent dopants are not available, or available in molar amounts less than 0.01% of the molar amount of divalent europium.

In a specific embodiment, the phosphor may in addition or alternative to the luminescent rare earth ions (RE) (also) include non-luminescent rare earth ions. For the sake of understanding, this is not included in the basic formula, but in an alternative embodiment, the phosphor of formula (I) could also be rewritten as a phosphor having the formula

$$(M_{1-x-y-z})_2D_2C_{2-2b}B_bA_2N_6:ES_x,RE_y,NRE_z \quad (I)$$

Here, 0≤z<1; 0<x+y+z<0.4; b, x, and y as defined above, wherein NRE is selected from the group consisting of Sc (scandium), La (lanthanum), and Lu (lutetium).

Conditions wherein x/y<0.1 or wherein y/x<0.1 indicate that either RE=Ce is predominantly present as luminescent species or ES=Eu is predominantly present as luminescent species. Note that these embodiments may also include the variants wherein x=0 (only Ce) or y=0 (only Eu), respectively.

Especially good phosphors may be obtained with A comprising Ca and/or Sr. Especially, D comprises Mg. Further, b is especially 0 and(/or) C may especially comprise Li. In this way, most efficient phosphors may be obtained. Further, especially Ln comprises trivalent Ce and/or divalent Eu, especially substantially only divalent Eu (and no other ES or RE). In yet a further embodiment, RE is selected from the group consisting of trivalent Ce, Pr, Sm, Gd, Tb, and Dy. In a preferred embodiment, 0<x≤0.2; in other words, at least divalent Sm and/or Eu are present, especially substantially only divalent Eu. In a further embodiment, y (and z) are (substantially) zero.

The condition 0<x+y≤0.4 indicates that M may be substituted with in total up to 40% of ES and/or RE. The condition "0<x+y≤0.4" in combination with x and y being between 0 and 0.2 indicates that at least one of ES and RE are present. Not necessarily both types are present. As indicated above, both ES and RE may each individually refer to one or more subspecies, such as ES referring to one or more of Sm and Eu, and RE referring to one or more of Ce, Pr, Nd, Sm, Eu, Gd, Tb, Dy, Ho, Er, and Tm.

Especially, when europium is applied as divalent luminescent species or dopant, the molar ratio between samarium and europium (Sm/Eu) is <0.1, especially <0.01, especially <0.001.

The same applies when europium in combination with ytterbium would be applied. When europium is applied as divalent luminescent species or dopant, the molar ratio between ytterbium and europium (Yb/Eu) is <0.1, especially<0.01, especially <0.001. would all three together be applied, then the same molar ratios might apply, i.e. ((Sm+Yb)/Eu) is <0.1, especially <0.01, especially <0.001.

Especially, x is especially in the range of 0.001-0.2 (i.e. $0.001 \leq x \leq 0.2$), like 0.002-0.2, such as 0.005-0.1, especially 0.005-0.08. Especially in the case of divalent Europium in the herein described systems, the molar percentage may be in the range of 0.1-5% ($0.001 \leq x \leq 0.05$), such as 0.2-5%, like 0.5-2%. For other luminescent ions, x may (but is not necessarily) in embodiments be equal to or larger than 1% (x equal to or larger than 0.01). In a specific embodiment, Ln substantially only comprises $Eu^{2+}$.

In yet a further embodiment, RE comprises Ce, and x/y<0.1, especially <0.01, even more especially <0.001, and n≤0.1. Hence, in this embodiment, RE comprises, or especially consists of cerium. This implies that when trivalent Ce is applied (as RE), optional divalent lanthanides SE are present in a molar amount that is less than 10% of the molar amount of Ce, respectively. For instance, when Ce is present, with y=0.05, for instance x1 for (divalent) Sm may be 0.001, and x2 for (divalent) Eu may be 0.001, leading to an x=x1+x2=0.002. In such instance, x/y=0.04. Even more especially, x=0.

When cerium is present, y is especially in the range of 0.001-0.2 (i.e. $0.001 \leq y \leq 0.2$), like 0.002-0.2, such as 0.005-0.1, especially 0.005-0.08. In a specific embodiment, Ln substantially only comprises $Ce^{3+}$; see further also below.

As indicated above, RE elements may be incorporated in the lattices to increase stability or to modify the emission characteristics. Incorporation of RE typically lead to a blue shift of the Eu(II) emission bands. Ce(III) incorporation may lead to emission in the green to orange spectral range. Codoping of the Eu(II) doped compounds with Ce(III) may be used to increase the absorption in the blue spectral range with Ce(III) acting as a sensitizer for the Eu(II) emission (see also above).

In a specific embodiment, the phosphor is selected from the group consisting of $Ca_2Mg_2Li_2Si_2N_6$:Eu, and $(Ca,Sr)_2Mg_2Li_2Si_2N_6$:Eu, etc.

As also indicated herein, the notation "(Sr,Ca)", and similar notations with other elements, indicates that the M-positions are occupied with Sr and/or Ca cations (or other elements, respectively). In an embodiment of $(Ca,Sr)_2Mg_2Li_2Si_2N_6$:Eu M may especially comprise Ca and Sr, more especially in a ratio selected from the range of 2:1-20:1. Likewise, D may be selected from one or more of Li, Mg, Mn, Zn, Cd, Al and Ga. For instance, D may comprise Li and Mg, or Li and Al.

Especially, M is selected from the group consisting of Ca, Sr, and Ba. Further, especially D is selected from the group consisting of Li, Mg, Zn, Al, and Ga. In yet an embodiment, C is especially selected from the group consisting of monovalent Li and Cu. Yet in an embodiment, B is especially selected from the group consisting of Mg, Zn and Mn, but b may especially be selected 0. Yet in an embodiment, A is especially selected from the group consisting of Si and Ge. Such systems may be relatively efficient. Note that the phrase "selected from the group consisting" may also include that two or more of these group are selected (such as M=Ca+Sr), etc. Hence, in a specific embodiment the invention provides the phosphor comprising $M_2D_2C_{2-2b}B_bA_2N_6$:Ln (I), wherein M comprises one or more of Ca and Sr (especially wherein M (substantially) consists of one or more of Ca and Sr), wherein D comprises Mg (especially wherein D (substantially) consists of Mg), wherein C comprises Li (especially wherein C (substantially) consists of Li) and b=0, wherein A comprises Si (especially wherein A (substantially) consists of Si), and wherein Ln comprises one or more of divalent Eu and trivalent Ce, especially wherein Ln (substantially) consists of one or more of Eu(II) and Ce.

In yet a further specific embodiment, the invention provides the phosphor comprising $(M_{1-x})_2D_2C_{2-2b}B_bA_2N_6$:$Eu_x$, wherein especially 0<x<0.2. Alternatively, the phosphor may comprise (only) cerium. Hence, in yet a specific embodiment the invention provides the phosphor $(M_{1-y})_2D_2C_{2-2b}B_bA_2N_6$:$Ce_y$, wherein especially 0<y≤0.2. Especially, in an embodiment the invention provides the phosphor comprising $M_2Mg_2Li_2Si_2N_6$:Ln, wherein M comprises one or more of Ca and Sr. Each of these specific phosphor embodiments may further also relate to lighting device embodiment including such phosphor.

In general as will be clear to a person skilled in the art, D, C, and B, are, in combination with M, A and nitrogen (N) chosen to provide a chemical formula that complies with charge neutrality. Hence, the total charge of $D_2C_{2-2b}B_b$ is equal to 6. Examples of $D_2C_{2-2b}B_b$ are e.g. $Li_3Al$, or $Mg_2Li_2$, or $ZnMgLi_2$, optionally even $Mg_3$, etc.

Referring to divalent europium: because only one lattice site may be present for $Eu^{2+}$ incorporation, the emission bands of the claimed phosphors are significantly narrower than state of the art red emitting phosphors like $M_2Si_5N_8$:Eu (M=Ba, Sr, Ca) which is advantageous in lighting applications since the amount of low energy light for which the human eye is insensitive is lowered. An advantage of the ordered structure variants that is found for some of the claimed compositions is that $Eu^{2+}$ shows narrower emission bands if incorporated in such lattices. This may be caused by less inhomogeneous broadening of the emission band. Analysis of the observed emission spectra with a simple configurational coordinate model (see Henderson, Imbusch: Optical Spectroscopy of Inorganic Solids, Clarendon Press, 1989) reveals Huang-Rhys coupling parameters S in the range 3-4 and average phonon frequencies hω in the range 250-400 $cm^{-1}$.

In yet a further specific embodiment, the invention provides a coated phosphor. In yet another specific embodiment, the invention provides an embedded phosphor. In the former embodiment, the coated embodiment, especially the phosphor is a particulate phosphor, with phosphor particles comprising a coating. However, the phosphor may also comprise a layer that is coated on one or both sided with a coating. In the latter embodiment, the phosphor may be embedded in an organic or inorganic host material. For instance, the phosphor may comprise a particulate phosphor, wherein the particles of the particulate phosphor are embedded in an organic or inorganic host, like e.g. PMMA, PET, PC, silsesquioxane, glass, etc. In a specific embodiment, the phosphor comprises an $AlPO_4$ coating. Such coating may e.g. be provided by a method described by Cho et al. (2005) in "Control of $AlPO_4$-nanoparticle coating on $LiCoO_2$ by using water or ethanol", Electrochimica Acta 50, 4182-4187. One or more alternative or additional coatings may include one or more of an $Al_2O_3$ coating and a $SiO_2$ coating. An $Al_2O_3$ coating may be prepared by e.g. atomic layer deposition (such as e.g. described in Avci, N.; Musschoot, J.; Smet, P. F.; Korthout, K.; Avci, A.; Detavernier, C.; Poelman, D. Microencapsulation of Moisture-Sensitive CaS:$Eu^{2+}$ Particles with Aluminum Oxide. J. Electrochem. Soc. 2009, 156, J333-J337). A silica coatings may for e.g. be prepared via sol-gel. Such method may include stirring phosphor powder in ethanol with some tetramethoxysilane. Then, concentrated $NH_3$ solution is added. After ammonia addition, tetraethoxysilane in ethanol can be added in a closed system while stirring; optionally sonication may be applied. The suspension thus obtained can be filtered, washed and dried.

The present invention advantageously provides alternative phosphors, which amongst others may advantageously have one or more of the following properties: (1) emitting in one or more parts of the visible spectrum, at least in one or more of the green, yellow and the red, especially the red, (2) having a good efficiency, (3) having a narrow band width (in the red), (4) having a high color rendering Ra (assuming a red phosphor), and (5) having other advantageous (optical) properties (such as a long life time/high stability).

The term "phosphor" is herein used for any material that upon excitation emits radiation in the visible part of the spectrum. Another term for "phosphor" may be luminescent material, but this term "luminescent material" is herein reserved for a material or material mixture comprising at least the phosphor (having formula (I) as defined herein and optionally also one or more other phosphors (see also below).

The term phosphor may in an embodiment relate to a particulate phosphor and in another embodiment relate to a (mono crystalline) phosphor layer. In a specific embodiment, the term phosphor may include a self-supporting layer, such as a ceramic polycrystalline material. Likewise, the term "luminescent material" may in an embodiment relate to a particulate "luminescent material" and in another embodiment relate to a (mono crystalline) "luminescent material" layer. In a specific embodiment, the term "luminescent material" may include a self-supporting layer, such as a ceramic material.

The term "ceramic" especially relates to an inorganic material that is—amongst others—obtainable by heating a (poly crystalline) powder at a temperature of at least 500° C., especially at least 800° C., such as at least 1000° C., like at least 1400° C., under reduced pressure, atmospheric pressure or high pressure, such as in the range of $10^{-8}$ to 500 MPa, such as especially at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicated above. The ceramic obtainable by such method may be used as such, or may be further processed (like polishing). A ceramic especially has density that is at least 90% (or higher, see below), such as at least 95%, like in the range of 97-100%, of the theoretical density (i.e. the density of a single crystal). A ceramic may still be polycrystalline, but with a reduced, or strongly reduced volume between grains (pressed particles or pressed agglomerate particles). The heating under elevated pressure, such as HIP, may e.g. be performed in an inert gas, such as comprising one or more of $N_2$ and argon (Ar). Especially, the heating under elevated pressures is preceded by a sintering process at a temperature selected from the range of 700-1900° C., such as 900-1800° C. Such sintering may be performed under reduced pressure, such as at a pressure of 10' Pa or lower. Such sintering may already lead to a density of in the order of at least 95%, even more especially at least 99%, of the theoretical density. After both the pre-sintering and the heating, especially under elevated pressure, such as HIP, the density of the ceramic body can be close to the density of a single crystal. However, a difference is that grain boundaries are available in the ceramic body, as the ceramic body is polycrystalline. Such grain boundaries can e.g. be detected by optical microscopy or SEM. Hence, herein the ceramic body especially refers to a sintered polycrystalline having a density substantially identical to a single crystal (of the same material). Such body may thus be highly transparent for visible light (except for the absorption by the light absorbing species such as especially $Eu^{2+}$).

However, also in general, uniaxial or isostatic pressure may be applied to obtain the phosphor. Hence, in an embodiment, the invention also provides a method for producing the herein described phosphor by selecting starting materials in ratios that can lead to at least the desired phosphor and heating, in an embodiment under pressure, especially uniaxial or isostatic pressure, even more especially isostatic pressure, the starting materials to produce at least the desired phosphor. In the case of isostatic pressure it is especially suitable if the pressure transmitting gas phase comprises nitrogen. It has been found that nitrogen can prevent nitride phosphor material decomposition at elevated temperatures and thus enhances the properties of the target material. Nitrogen partial pressures in the range 0.001-200 MPa may be applied. Temperatures of especially at least 800° C. may be applied, up to about 1500° C., and total gas pressures from atmospheric pressure up to the above indicated pressures or even above.

As indicated above and/or as can be derived from the above, the luminescent material, and thus also the ceramic material in case a ceramic luminescent material is applied, may include one or more of the herein described phosphors and optionally one or more of (a) one or more other type of phosphors, (b) one or more other phases formed during synthesis of the one or more of the herein described phosphors (respectively), (c) one or more starting materials used during synthesis of the one or more of the herein described phosphors (respectively), (d) one or more fluxes used during synthesis of the one or more of the herein described phosphors (respectively), (e) one or more scattering materials, and (f) one or more other materials (such as a halide salt).

The term "comprising" may in an embodiment refer to "consisting of" but may in another embodiment also refer to "containing at least the defined species and optionally one or more other species". The phrase "selected from the group consisting of trivalent" may refer in an embodiment to a single species selected from the group, but may in another embodiment also refer to one or more species selected from that group. Hence, sometimes the phrase "one or more selected from the group consisting of" is also applied. Therefore, phrases like "M selected from the group consisting of Ca, Sr, and Ba" may indicate one or more M (species) selected from the group consisting of Ca, Sr, and Ba. Therefore, such phrase also relate to combinations of two or more (where applicable).

The term light source may in principle relate to any light source known in the art, but may especially refers to a LED-based light source, herein further indicated as LED. The description below will—for the sake of understanding—only addresses LED-based light sources. The light source is configured to provide UV and/or blue light. In a preferred embodiment, the light emitting diode is configured to generate LED light with a blue component. In other words, the light source comprises a blue LED. Hence, in an embodiment, the light source is configured to generate blue light. Especially, the LED is a solid state LED.

In yet another embodiment, the light emitting diode is configured to generate LED light with a UV component. In other words, the light source comprises a UV LED. When a UV light source is applied and blue or white light is desired, as blue component, for instance the well-known materials $BaMgAl_{10}O_{17}:Eu^{2+}$ or $(Sr,Ba,Ca)_5(PO_4)_3Cl:Eu^{2+}$ may be applied. However, also other luminescent materials that are able to convert UV light into blue light may alternatively or additionally be applied.

Preferably, the light source is a light source that during operation emits at least light at a wavelength selected from the range of 200-490 nm, especially a light source that during operation emits at least light at wavelength selected from the range of 400-490 nm, even more especially in the range of 440-490 nm. This light may partially be used by the luminescent material(s) (see below). In a specific embodiment, the light source comprises a solid state LED light source (such as a LED or laser diode).

The term "light source" may also relate to a plurality of light sources, such as 2-20 (solid state) LED light sources. Hence, the term LED may also refer to a plurality of LEDs. Hence, in a specific embodiment, the light source is configured to generate blue light.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The luminescent material comprises one or more phosphors as described herein, and optionally one or more further phosphors selected from the group consisting of divalent europium containing nitride luminescent material or a divalent europium containing oxonitride luminescent material. The red luminescent material may in an embodiment comprise one or more materials selected from the group consisting of $(Ba,Sr,Ca)S:Eu$, $(Mg,Sr,Ca)AlSiN_3:Eu$ and $(Ba,Sr,Ca)_2Si_{5-x}Al_xO_xN_{8-x}:Eu$, especially with x in the range of 0-5, even more especially with x in the range of 0-2, even more especially $0<x\leq0.2$, such as at least 0.02. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":$Eu^{2+}$", indicates that part of the metal ions is replaced by Eu (in these examples by $Eu^{2+}$). For instance, assuming 2% Eu in $CaAlSiN_3$:Eu, the correct formula could be $(Ca_{0.98}Eu_{0.02})AlSiN_3$. Divalent europium will in general replace divalent cations, such as the above divalent alkaline earth cations, especially Ca, Sr or Ba. The material $(Ba,Sr,Ca)S:Eu$ can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba,Sr,Ca)_2Si_{5-x}Al_xO_xN_{8-x}:Eu$ can also be indicated as $M_2Si_{5-x}Al_xO_xN_{8-x}:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as $Ba_{1.5}Sr_{0.5}Si_5N_8$:Eu, (i.e. 75% Ba; 25% Sr). Here, Eu is introduced and replaces at least part of M i.e. one or more of Ba, Sr, and Ca). Likewise, the material $(Ba,Sr,Ca)AlSiN_3$:Eu can also be indicated as $MAlSiN_3$:Eu wherein M is one or more elements selected from the group consisting of barium $(Ba)_5$ strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Preferably, in an embodiment the first luminescent material comprises $(Ca,Sr,Mg)AlSiN_3$:Eu, preferably $CaAlSiN_3$:Eu. Further, in another embodiment, which may be combined with the former, the first luminescent material comprises $(Ca,Sr,Ba)_2Si_5N_8$:Eu, preferably $(Sr,Ba)_2Si_5N_8$:Eu. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc.

Hence, in an embodiment the luminescent material may further comprises $M_2Si_5N_8:Eu^{2+}$, wherein M is selected from the group consisting of Ca, Sr and Ba, even more especially wherein M is selected from the group consisting of Sr and Ba. In yet another embodiment, which may be combined with the former, the luminescent material may further comprise $MSiAlN_3:Eu^{2+}$, wherein M is selected from the group consisting of Ca, Sr and Ba, even more especially wherein M is selected from the group consisting of Sr and Ba.

The luminescent material may also comprise one or more phosphors selected from the group consisting of a trivalent cerium containing garnet and a trivalent cerium containing oxonitride. The oxonitride materials are in the art often also indicated as oxonitride materials.

Especially, the luminescent material may further comprise a $M_3A_5O_{12}:Ce^{3+}$ luminescent material, wherein M is selected from the group consisting of Sc, Y, Tb, Gd, and Lu, wherein A is selected from the group consisting of Al and Ga. Preferably, M at least comprises one or more of Y and Lu, and wherein A at least comprises Al. These types of materials may give highest efficiencies. In a specific embodiment, the second luminescent material comprises at least two luminescent materials of the type of $M_3A_5O_{12}:Ce^{3+}$, wherein M is selected from the group consisting of Y and Lu, wherein A is selected from the group consisting of Al, and wherein the ratio Y:Lu differ for the at least two luminescent materials. For instance, one of them may be purely based on Y, such as $Y_3Al_5O_{12}:Ce^{3+}$, and one of them may be a Y,Lu based system, such as $(Y_{0.5}Lu_{0.5})_3Al_5O_{12}:Ce^{3-}$. Embodiments of garnets especially include $M3A_5O_{12}$ garnets, wherein M comprises at least yttrium or lutetium and wherein A comprises at least aluminum. Such garnet may be doped with cerium (Ce), with praseodymium (Pr) or a combination of cerium and praseodymium; especially however with Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3Al_5O_{12}:Ce$, wherein x is equal to or larger than 0 and equal to or smaller than 1. The terms ":Ce" or ":Ce$^{3+}$" (or similar terms), indicate that part of the metal ions (i.e. in the garnets: part of the "M" ions) in the luminescent material is replaced by Ce (or another luminescent species when the term(s) would indicate that, like ":Yb"). For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art. Note that in these YAG examples x is e.g. used to indicate the replacement of Y by Lu.

Therefore, the luminescent material may in an embodiment further comprise one or more other phosphors selected from the group consisting of a divalent europium containing nitride luminescent material, a divalent europium containing oxonitride luminescent material, a trivalent cerium containing garnet and a trivalent cerium containing oxonitride.

As will be clear to the person skilled in the art, also combinations of phosphors may be applied. Further, as will be clear to the person skilled in the art, optimization of the luminescent material(s) (or phosphors) with respect to one or more of constituting elements, activator concentration, particle size, etc. or optimization with respect to luminescent material combination(s), may be applied to optimize the illumination device.

The luminescent material may especially comprise at least 10 wt. % of the herein described phosphor (of formula I), such as at least 20 wt. %, even more especially at least 30 wt. %. Note that in embodiments of the application different luminescent materials, including the herein described new phosphor and/or other luminescent materials may also be arranged at different locations in a device, especially in remote applications. The lighting device will however at least comprise the herein described phosphor (I). Hence, in embodiment the luminescent material may comprise at least 80 wt. %, such as at least 85 wt. % of the herein described phosphor (of formula I).

The light source may be configured in a chamber, with reflective wall(s) (such as coated with a reflective material like $TiO_2$), and a transparent window. In an embodiment, the window is the light conversion layer. In yet a further embodiment, the window comprises the light conversion layer. This layer may be arranged upstream of the window or downstream of the window. In yet a further embodiment, light conversion layers are applied at both sides of the window.

The terms "upstream" and "downstream" relate to an arrangement of items or features relative to the propagation of the light from a light generating means (here the light source), wherein relative to a first position within a beam of light from the light generating means, a second position in the beam of light closer to the light generating means is "upstream", and a third position within the beam of light further away from the light generating means is "downstream".

The luminescent material is configured to convert at least part of the light source light. In order words, one may say that the light source is radiationally coupled to the luminescent material. When the light source comprises a substantially UV light emitting light source, the luminescent material may be configured to convert substantially all light source light that impinges on the luminescent material. In case the light source is configure to generate blue light, the luminescent material may partly convert the light source light. Dependent upon the configuration, a part of the remaining light source light may be transmitted through a layer comprising the luminescent material.

Here, a number of applications of the invention are indicated: office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, and green house lighting systems.

As indicated above, the lighting unit may be used as backlighting unit in an

LCD display device. Hence, in a further aspect, the invention provides also a LCD display device comprising the lighting unit as defined herein, configured as backlighting unit.

The term "substantially" herein, such as in "substantially all emission" or in "substantially consists", will be understood by the person skilled in the art. The term "substantially" may also include embodiments with "entirely", "completely", "all", etc.

Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "comprising" may in an embodiment refer to "consisting of" but may in another embodiment also refer to "containing at least the defined species and optionally one or more other species". The term "and/or" especially relates to one or more of the items mentioned before and after "and/ or". For instance, a phrase "item 1 and/or item 2" and similar phrases may relate to one or more of item 1 and item 2.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2:(a) view along the a-axis and
  (b) along c-axis of $M_{2-x}D_2C_2A_2N_{6,\ 1.}$ M atoms, 3: C atoms, 2: $A_2N_6$ bow tie units, nitrogen atoms: 5. 4: Edge connected tetrahedra chains $DN_{4/2}$ running along a;

FIG. 3: view along a of $M_{2-2x}D_2BA_2N_6$. Monovalent C atoms are fully replaced by divalent B atoms 6;

DETAILED DESCRIPTION OF THE EMBODIMENTS

Figure 1A:
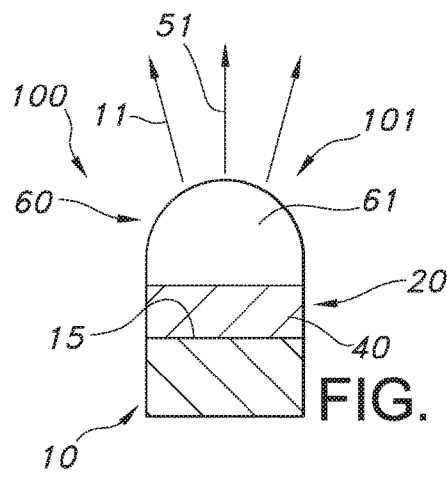
FIGS. 1a-1d schematically depict some embodiments of the lighting unit; the drawings are not necessarily on scale.

FIG. 1a schematically depicts an embodiment of the lighting unit, indicated with reference 100, of the invention. The lighting unit comprises a light source 10, which is in this schematic drawing a LED (light emitting diode). In this embodiment, on top of the light source 10, here on the (light exit) surface 15, thus downstream of the light source 10, a luminescent material 20 is provided. This luminescent material 20 comprises phosphor as described herein, indicated with reference 40. By way of example, the lighting unit 100 further comprises, for instance for light extraction properties, a (transmissive) dome 61. This is an embodiment of a transmissive optical element 60, which is in this embodiment arranged downstream of the light source 10 and also downstream of the light conversion layer 20. The light source 10 provides light source light 11 (not indicated in the drawing), which is at least partly converted by the light conversion layer 20, at least by phosphor 40, into luminescent material light 51. The light emanating from the lighting unit is indicated with reference 101, and contains at least this luminescent material light 51, but optionally, dependent upon the absorption of luminescent material 50 also light source light 11.

Figure 1B:
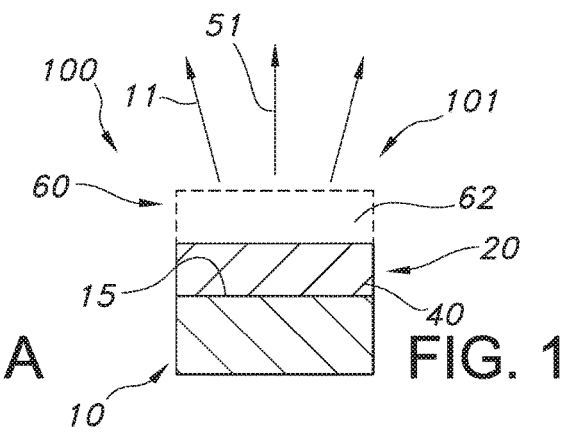

FIG. 1b schematically depicts another embodiment, without dome, but with an optional coating 62. This coating 62 is a further example of a transmissive optical element 60. Note that the coating 62 may in an embodiment be one or more of a polymeric layer, a silicone layer, or an epoxy layer. Alternatively or additionally a coating of silicon dioxide and/or silicon nitride may be applied.

Figure 1C:
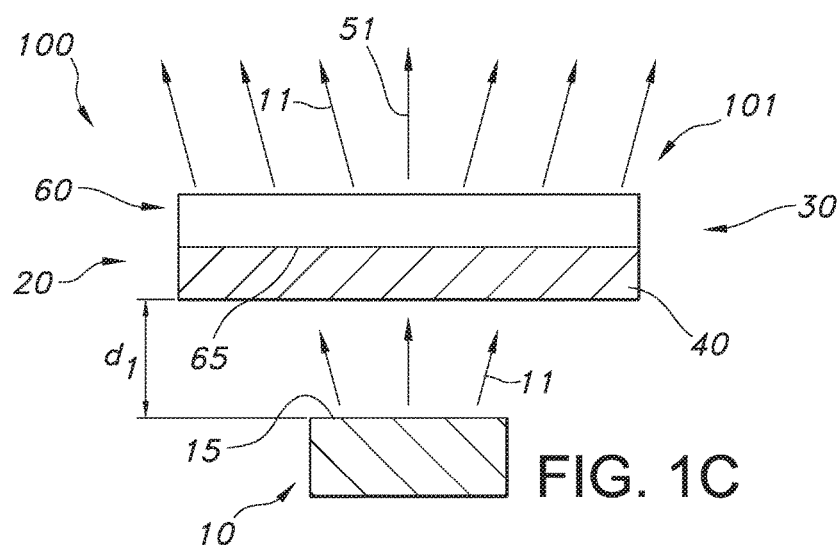
Figure 1D:
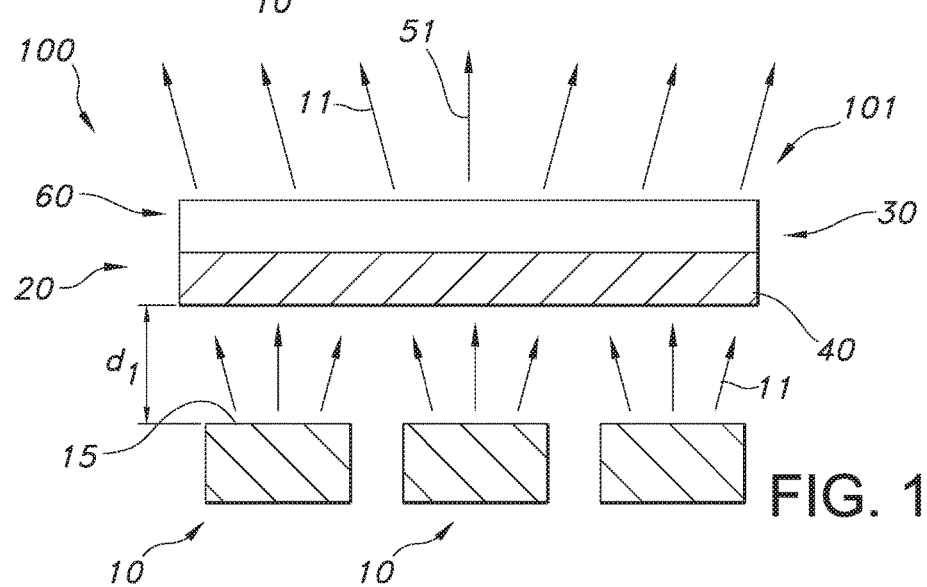
Figure 4A:
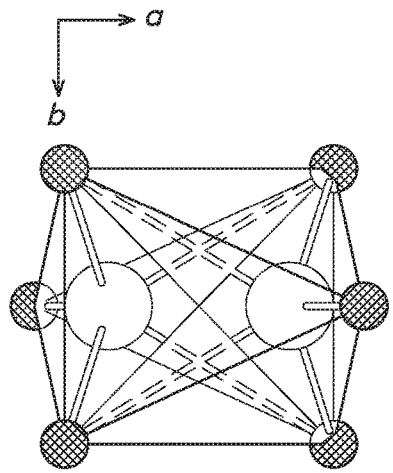
FIG. 4: Threefold coordination of C atoms and octahedral coordination of two C atoms (a), Fourfold coordination of B atoms in $M_{2-2x}D_2C_{2-2b}B_bA_2N_6$:Ln (b)
Figure 4B:
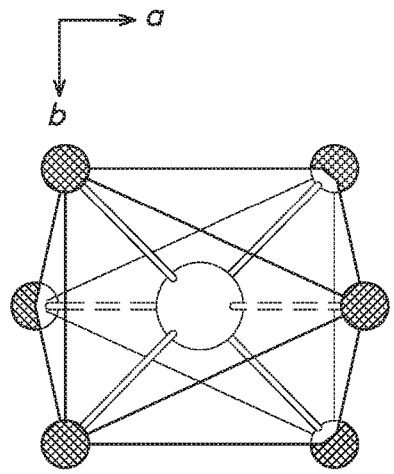

In both schematically depicted embodiment of FIGS. 1a-1b, the luminescent material 20 is in physical contact with the light source 10, or at least its light exit surface (i.e. surface 15), such as the die of a LED. In FIG. 1c, however, the luminescent material 20 is arranged remote from the light source 10. In this embodiment, the luminescent material 20 is configured upstream of a transmissive (i.e. light transmissive) support 30, such as an exit window. The surface of the support 30, to which the light conversion layer 20 is applied, is indicated with reference 65. Note that the luminescent material 20 may also be arranged downstream of the support 30, or at both sides of the support luminescent material 20 may be applied. The distance between the luminescent material 20 and the light source (especially its light exit surface 15) is indicated with reference dl, and may be in the range of 0.1 mm-10 cm. Note that in the configuration of FIG. 1c, in principle also more than one light source 10 may be applied.

FIG. 1 d is schematically the same as FIG. 1c, but now with a plurality of light sources 10.

Optionally, the luminescent material is shaped into a self-supporting layer, such as a ceramic material. In such instance, the transmissive optical element 60 may not be necessary, but may nevertheless be present.

EXPERIMENTAL

As indicated above, synthesis of the claimed materials can be carried out by a variety of processing methods. It has been found by the inventors that keeping firing temperatures in the range of 800-1300° C. improves phase purity and luminescence properties of the claimed phases. It turned out that reactive precursors like intermetallic phases obtained by melting of the constituent M, D, C, B, A and rare earth/lanthanide metals, alkaline earth amides, or silicon diimide are especially suitable. The addition of flux materials like fluorides or chlorides is also improving phase formation. Suitable synthesis methods comprise high pressure nitridation, processing in alkaline metal melts, ammonothermal synthesis and standard mix and fire approaches.

Example 1

$Ca_{1.99}Mg_2Li_2Si_2N_6:Eu_{0.01}$ (i.e. $(Ca_{0.995}Eu_{0.005})_2Mg_2Li_2Si_2N_6$; i.e. x=0.005)

5.531 g (131.4 mmole) $CaH_2$, 5.611 g (40 mmole) $Si_3N_4$, 1.393 g (40 mmole) $Li_3N$, 2.917 g (120 mmole) Mg, and 0.125 g (0.6 mmole) EuF3 are mixed and sintered under forming gas (5% $H_2$) at 1100° C. for 2 h.

Figure 5:
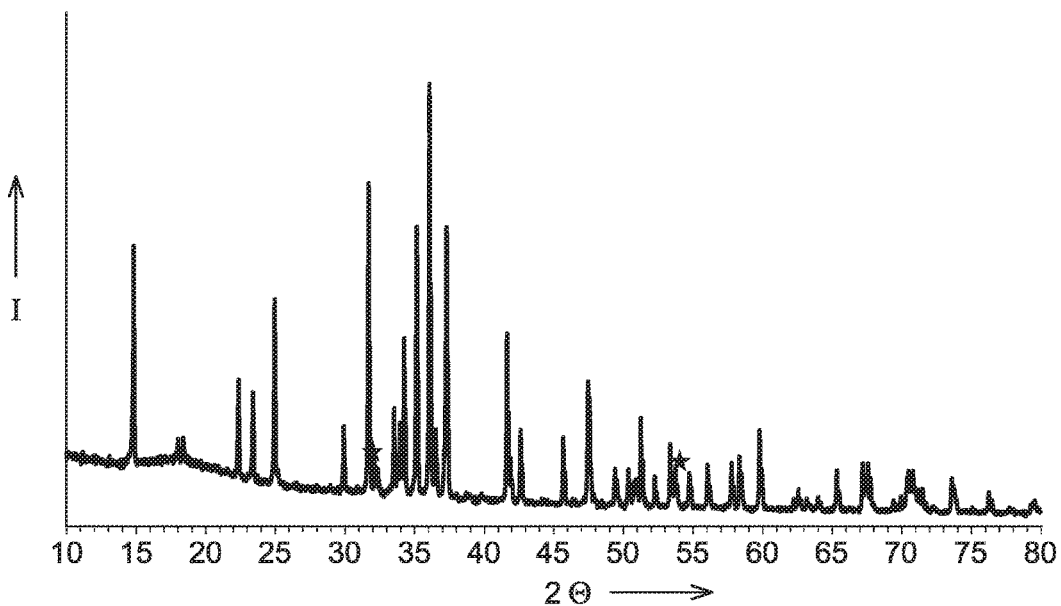
FIG. 5: XRD diffraction pattern of $Ca_2Mg_2Li_2Si_2N_6$:Eu. CaO secondary phase reflections are marked with stars.
Figure 6:
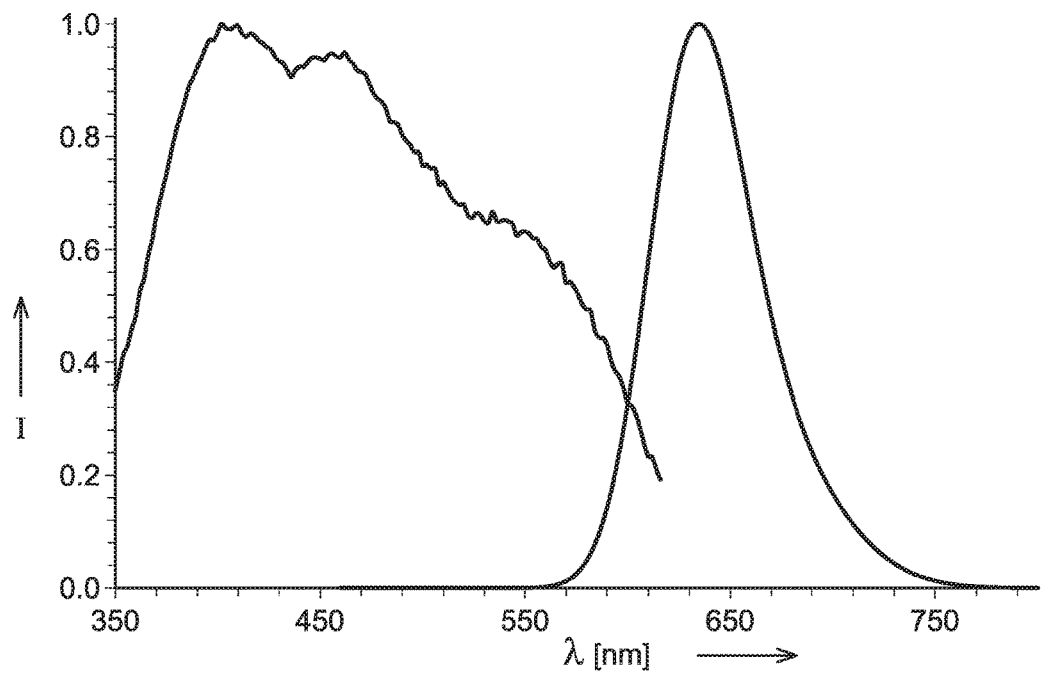
FIG. 6: Excitation (monitored at 635 nm) and emission (440 nm excitation) specra of example 1.

The powder phosphor was analyzed by means of powder XRD with silicon as internal standard. The phosphor crystallizes in the monoclinic $Ca_2Mg_2Li_2Si_2N_6$ structure with lattice constants a=5.5579 Å, b=9.8285 Å, c=6.0050 Å and β=97.25°. FIG. 5 shows the powder XRD pattern of the raw phosphor powder. CaO secondary phase is removed by washing with ammonia solution. Excitation at 440 nm leads to emission in the red spectral range with a peak emission at 639 nm, and a spectral width FWHM=1550 cm$^{-1}$ (CIE color coordinates x,y=0.687, 0.313, lumen equivalent LE=129.4 lm/W). The spectra are depicted in FIG. 6. The inventors believe that the three excitation maxima located at ~410, 460 and 550 nm are due to the reduced symmetry of the octahedral $EuN_6$ coordination that removes the energetic degeneracy of the three 5d $t_{2g}$ states in an ideal octahedral coordination.

Example 2

$(Ca_{0.8}Sr_{0.2})_{1.99}Mg_2Li_2Si_2N_6:Eu_{0.01}$ (i.e. $(Ca_{0.796}Sr_{0.199}Eu_{0.005})_2Mg_2Li_2Si_2N_6$; i.e. x=0.005)

4.021 g (95.52 mmole) $CaH_2$, 2.141 g $SrH_2$ (23.88 mmole), 5.611 g (40 mmole) $Si_3N_4$, 1.393 g (40 mmole) $Li_3N$, 2.917 g (120 mmole) Mg, and 0.125 g (0.6 mmole) EuF3 are mixed and sintered in forming gas (5% $H_2$) at 1100° C. for 2 h.

Figure 7:
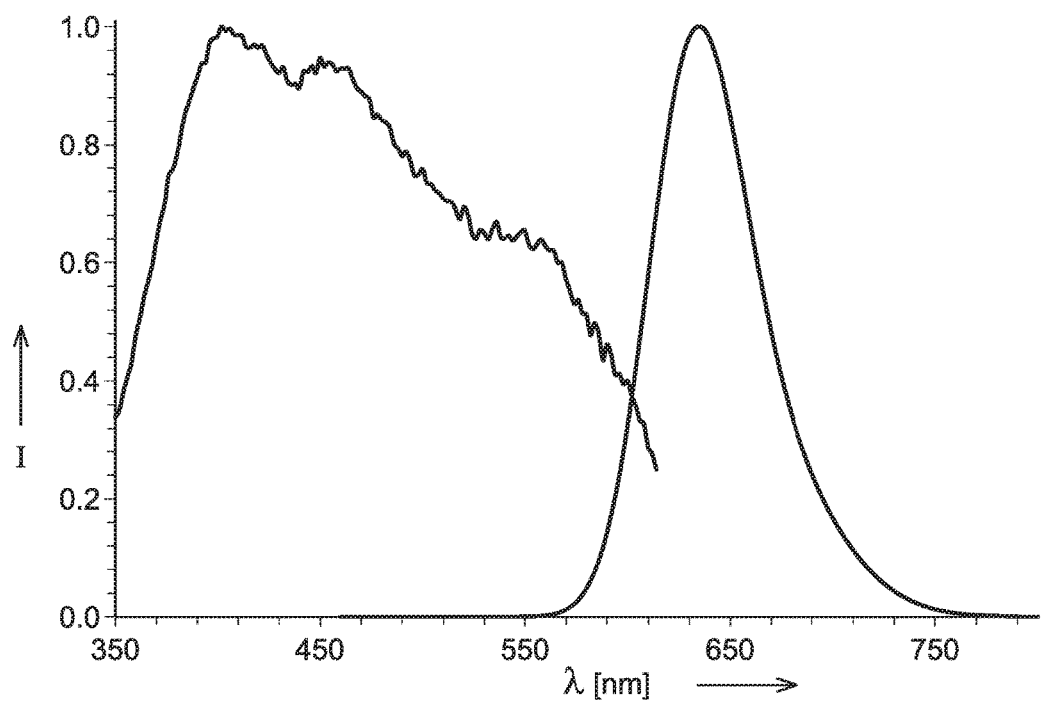
FIG. 7: Excitation (monitored at 635 nm) and emission (440 nm excitation) specra of example 2.

The powder phosphor was analyzed by means of powder XRD with silicon as internal standard. The phosphor crystallizes in the monoclinic $Ca_2Mg_2Li_2Si_2N_6$ structure with lattice constants a=5.5636 Å, b=9.8376 Å, c=6.0126 Å and β=97.26°. (Ca,Sr)O secondary phase is removed by washing with ammonia solution. Excitation at 440 nm leads to emission in the red spectral range with a peak emission at 635 nm, and a spectral width FWHM=1510 cm$^{-1}$ (CIE color coordinates x,y=0.680, 0.320, lumen equivalent LE=154.1 lm/W). The spectral blue shift of emission compared to example 1) is due to expansion of the host lattice by incorporation of the larger Sr atoms. Excitation and emission are shown in FIG. 7.

Example 3

$Ca_{1.84}Sr_{0.14}Mg_2Li_2Si_2N_6:Eu_{0.02}$ (i.e. $(Ca_{0.92}Sr_{0.07}Eu_{0.01})2Mg_2Li_2Si_2N_6$; i.e. x=0.01)

5 g (0.05 mole) $Mg_3N_2$, 18.8 g (0.15 mole) $SrF_2$, 33.5 g (0.1 mole) $Mg_3Ca_3N_2F_6$ prepared by mixing $Mg_3N_2$ and $CaF_2$ and firing the mixture under nitrogen at 950° C., 11.6 g (0.2 mole) $Si(NH)_2$, 9.8 g $Li_3N$ (0.2 mole), 13.9 g (2 mole) Li and 0.2 g (0.001 mole) $EuF_3$ are mixed and fired for 24 hrs in a sealed tantalum reaction container at 950° C. Orange microcrystals of $Ca_{1.84}Sr0.14Mg_2Li_2Si_2N_6:Eu_{0.02}$ are separated from the raw product powder by screening. Analysis of the material with EDX shows a composition that corresponds with that analyzed by means of X ray powder diffraction and Rietvelt refinement. Table 5 lists the EDX analysis results in weight %.

TABLE 5

EDX analysis results for $Ca_{1.84}Sr_{0.14}Mg_2Li_2Si_2N_6:Eu_{0.02}$ in weight %. Li cannot be detected with EDX.

| Ca | Sr | Mg | Si | N | Eu |
|---|---|---|---|---|---|
| 13.38 | 0.87 | 13.61 | 13.55 | 58.00 | 0.09 |

Figure 8:
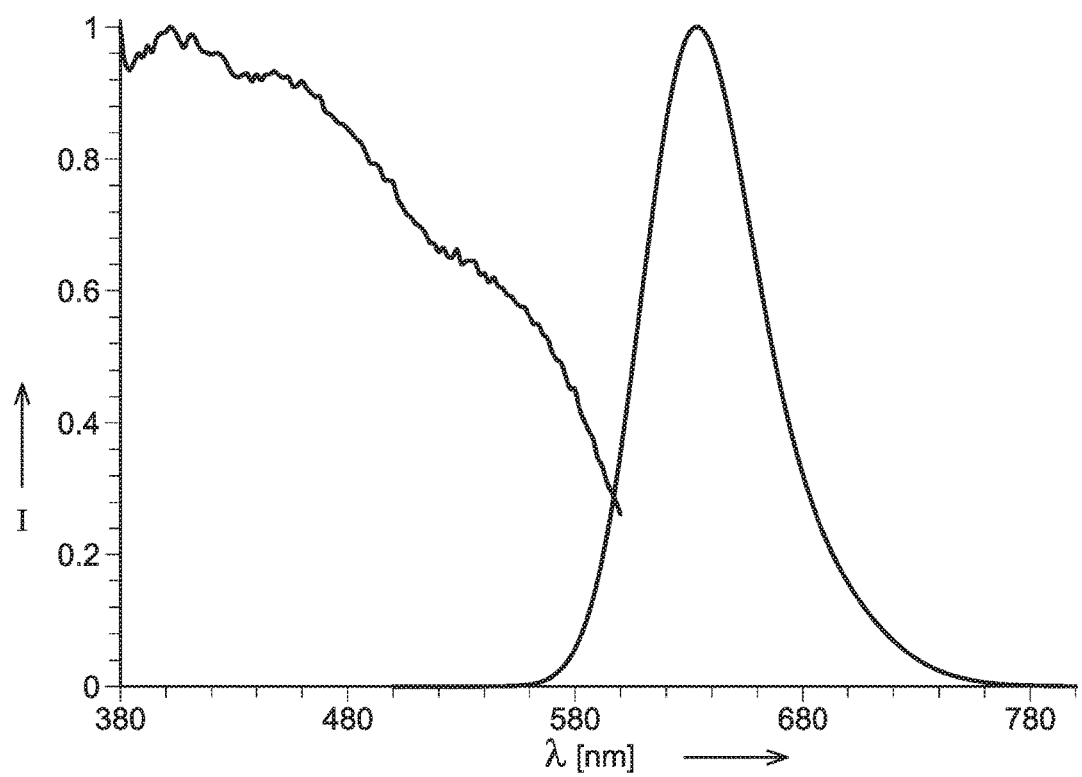
FIG. 8: Excitation (monitored at 634 nm) and emission (460 nm excitation) specra of example 3.

Excitation and emission are shown in FIG. 8.

Below, some alternative preparation methods for $Ca_{1.99}Mg_2Li_2Si_2N_6:Eu_{0.01}$ (see also example 1) are described.

Example 4

4.188 g (99.5 mmole) $CaH_2$, 1.161 g (33.3 mmole) $Li_3N$, 8.041 g (100.0 mmole) $MgSiN_2$, and 0.088 g (0.25 mmole) $Eu_2O_3$ are mixed and subsequently sintered under nitrogen gas at 1100° C. for 5 h. The precursor $MgSiN_2$ was synthesized by mixing 3.364 g (33.3 mmole) $Mg_3N_2$ and 4.676 g (33.3 mmole) $Si_3N_4$ and sintering under forming gas (5% $H_2$) at 1250° C. for 3 h. Excitation at 444 nm leads to an emission in the red spectral range with a peak emission at 638 nm, and a spectral width FWHM=1451 cm$^{-1}$.

Example 5

4.188 g (99.5 mmole) $CaH_2$, 1.161 g (33.3 mmole) $Li_3N$, 3.836 g (50.0 mmole) $Mg_2Si$, 1.404 g (50.0 mmole) Si, and 0.088 g (0.25 mmole) $Eu_2O_3$ are mixed and subsequently sintered under nitrogen gas at 1000° C. for 5 h. Excitation at 444 nm leads to an emission in the red spectral range with a peak emission at 637 nm, and a spectral width FWHM=1480 cm$^{-1}$.

Example 6

4.917 g (33.1 mmole) $Ca_3N_2$, 1.161 g (33.3 mmole) $Li_3N$, 3.364 g (33.3 mmole) $Mg_3N_2$ (or 2.431 g (100.0 mmole) Mg), and 0.104 g (0.5 mmole) $EuF_3$ are mixed and subsequently sintered under nitrogen gas at 1100° C. for 5 h. Excitation at 444 nm leads to an emission in the red spectral range with a peak emission at 639 nm, and a spectral width FWHM=1549 cm$^{-1}$.

Example 7

6.782 g (99.5 mmole) CaSi, 1.161 g (33.3 mmole) $Li_3N$, 3.364 g (33.3 mmole) $Mg_3N_2$ (or 2.431 g (100.0 mmole) Mg), and 0.104 g (0.5 mmole) $EuF_3$ are mixed and subsequently sintered under nitrogen gas at 1000° C. for 5 h. The precursor CaSi was synthesized by mixing 4.209 g (100.0 mmole) $CaH_2$ and 2.809 g (100.0 mole) Si and sintering under nitrogen at 975° C. for 3 h.

Example 8

5.182 g (50.0 mmole) $CaSi_2$:Eu, 2.094 g (49.75 mmole) $CaH_2$, 1.161 g (33.3 mmole) $Li_3N$, 2.431 g (100.0 mmole)

Mg, and 0.052 g (0.25 mmole) $EuF_3$ are mixed and sintered in forming gas (5% $H_2$) at 1100° C. for 2 h. The precursor $CaSi_2$:Eu was obtained by mixing 4.188 g (99.5 mmole) $CaH_2$, 5.617 g (200.0 mmole) Si, and 0.088 g (0.25 mmole) $Eu_2O_3$, followed by sintering in argon atmosphere at 975° C. for 3 h. Excitation at 444 nm leads to emission in the red spectral range with a peak emission at 639 nm, and a spectral width FWHM=1421cm$^{-1}$.

Example 9

9.303 g (100.0 mmole) CaMgSi:Eu, and 1.161 g (33.3 mmole) $Li_3N$ are mixed and sintered in forming gas (5% $H_2$) at 1100° C. for 2 h. The precursor CaMgSi:Eu was received by mixing 4.188 g (99.5 mmole) $CaH_2$, 2.431 g (100.0 mmole) Mg, 2.809 g (100.0 mmole) Si, and 0.088 g (0.25 mmole) $Eu_2O_3$, and sintering in argon atmosphere at 975° C. for 1.5 h. Excitation at 444 nm leads to an emission in the red spectral range with a peak emission at 638 nm, and a spectral width FWHM=1413 cm$^{-1}$.

A summary of some date of the Examples is given in Table 6.

TABLE 6 summary of some optical data of the samples made in the Examples 1-9

| Example | x | y | LE [lm/W] | Peak [nm] | FWHM [cm$^{-1}$] | Rel PL Intensity |
|---|---|---|---|---|---|---|
| 1 | 0.685 | 0.315 | 139 | 638 | 1420 | 1.00 |
| 2 | 0.672 | 0.328 | 155 | 635 | 1499 | 0.14 |
| 4 | 0.686 | 0.314 | 144 | 638 | 1451 | 0.38 |
| 5 | 0.683 | 0.317 | 146 | 637 | 1480 | 0.06 |
| 6 | 0.684 | 0.316 | 131 | 639 | 1549 | 0.18 |
| 8 | 0.686 | 0.314 | 135 | 639 | 1421 | 0.98 |
| 9 | 0.685 | 0.314 | 138 | 638 | 1413 | 0.88 |

Example 10

Figure 9:
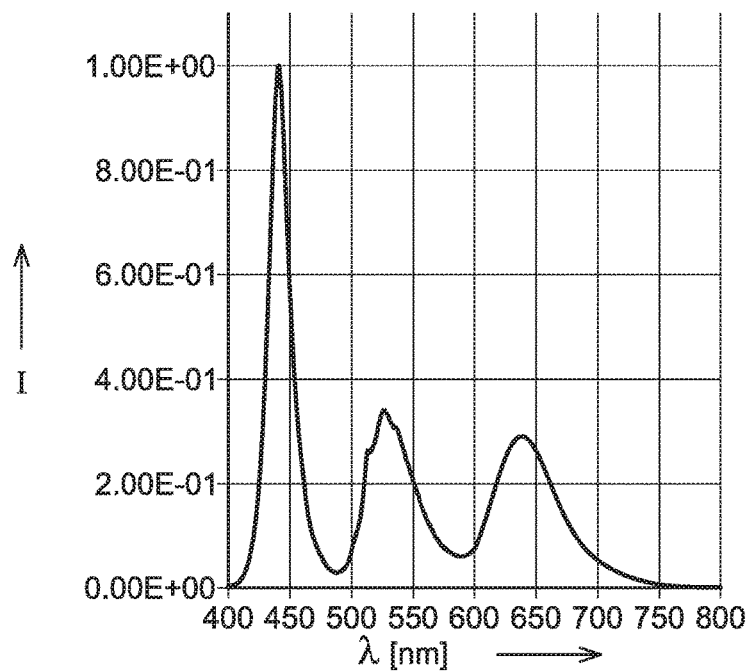
FIG. 9: Emission spectrum of the LED of example 10.

A mixture of the phosphor powder of example 1 and a commercially available green phosphor β-SiAlON:Eu in a heat curable silicone resin are dispensed in a LED package comprising a 441 nm emitting LED die in such a way that a CIE color point x,y=0.265, 0.2354 is realized (FIG. 9). Integration of the manufactured LEDs in an LCD backlighting unit results in a front of screen correlated color temperature of 8677K for the balanced white point (front of screen CIE color coordinate x,y=0.287,0.304). A color gamut performance of 94% (133%) NTSC (sRGB) is being reached. The emission spectrum of the LED of this example is shown in FIG. 9, with on the x-axis the wavelength (nm) and on the y-axis relative intensity (I) in arbitrary units.

The invention claimed is:

1. A lighting unit comprising a light source, configured to generate light source light and a luminescent material configured to convert at least part of the light source light into luminescent material light, wherein the light source comprises a light emitting diode (LED), and wherein the luminescent material comprises a phosphor selected from the class of

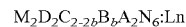

wherein
M=one or more selected from the group consisting of divalent Ca, Sr, and Ba;
D=one or more selected from the group consisting of monovalent Li, divalent Mg, Mn, Zn, Cd, and trivalent Al and Ga;
C=one or more selected from the group consisting of monovalent Li and Cu;
B=one or more selected from the group consisting of divalent Mg, Zn, Mn and Cd;
A=one or more selected from the group consisting of tetravalent Si, Ge, Ti, and Hf;
Ln=one or more selected from the group consisting of ES and RE;
ES=one or more selected from the group consisting of divalent Eu, Sm and Yb;
RE=one or more selected from the group consisting of trivalent Ce, Pr, Nd, Sm, Eu, Gd, Tb, Dy, Ho, Er, and Tm; and
wherein 0≤b≤1.

2. The lighting unit of claim 1, wherein M comprises one or more of Ca and Sr, wherein D comprises Mg, wherein C comprises Li and b=0, wherein A comprises Si, and wherein Ln comprises one or more of divalent Eu and trivalent Ce.

3. The lighting unit of claim 1, wherein the phosphor comprises $(M_{1-x})_2D_2C_{2-2b}B_bA_2N_6$:$Eu_x$, wherein 0<x≤0.2.

4. The lighting unit of claim 1, wherein the phosphor comprises $(M_{1-y})_2D_2C_{2-2b}B_bA_2N_6$:$Ce_y$, wherein 0<y≤0.2.

5. The lighting unit of claim 1, wherein the phosphor comprises $M_2Mg_2Li_2Si_2N_6$:Ln, wherein M comprises one or more of Ca and Sr.

6. The lighting unit of claim 1, wherein the luminescent material further comprises one or more other phosphors selected from the group consisting of a divalent europium containing nitride luminescent material, a divalent europium containing oxonitride luminescent material, a trivalent cerium containing garnet and a trivalent cerium containing oxonitride, and wherein the light source is configured to generate blue light.

7. A phosphor selected from the class of $$M_2D_2C_{2-2b}B_bA_2N_6:Ln \quad (I)$$

with
M=one or more selected from the group consisting of divalent Ca, Sr, and Ba
D=one or more selected from the group consisting of monovalent Li, divalent Mg, Mn, Zn, Cd, and trivalent Al and Ga;
C=one or more selected from the group consisting of monovalent Li and Cu;
B=one or more selected from the group consisting of divalent Mg, Zn, Mn and Cd;
A=one or more selected from the group consisting of tetravalent Si, Ge, Ti, and Hf;
Ln=one or more selected from the group consisting of ES and RE;
ES=one or more selected from the group consisting of divalent Eu, Sm and Yb;
RE =one or more selected from the group consisting of trivalent Ce, Pr, Nd, Sm, Eu, Gd, Tb, Dy, Ho, Er, and Tm; and
wherein 0≤b ≤1.

8. The phosphor of claim 7, wherein the phosphor comprises $M_2D_2C_{2-2b}B_bA_2N_6$:Ln (I), wherein M comprises one or more of Ca and Sr, wherein D comprises Mg, wherein C comprises Li and b=0, wherein A comprises Si, and wherein Ln comprises one or more of divalent Eu and trivalent Ce.

9. The phosphor of claim 7, wherein the phosphor comprises $(M_{1-x})_2D_2C_{2-2b}B_bA_2N_6$:$Eu_x$, wherein 0 <x ≤0.2.

10. The phosphor of claim 7, wherein the phosphor comprises $(M_{1-y})_2D_2C_{2-2b}B_bA_2N_6:Ce_y$, wherein $0 < y \leq 0.2$.

11. The phosphor of claim 7, wherein the phosphor comprises $M_2Mg_2Li_2Si_2N_6:Ln$, wherein M comprises one or more of Ca and Sr.

12. The phosphor of claim 7, wherein the phosphor comprises phosphor particles having a coating, wherein the coating comprises one or more coating selected from the group consisting of an $AlPO_4$ coating, an $Al_2O_3$ coating and a $SiO_2$ coating.

13. A method for making a phosphor, the method comprising steps of:
 combining a selection of starting materials to form the phosphor in the class of, $$M_2D_2C_{2-2b}B_bA_2N_6:Ln \quad (I)$$

wherein
M=one or more selected from the group consisting of divalent Ca, Sr, and Ba
D=one or more selected from the group consisting of monovalent Li, divalent Mg, Mn, Zn, Cd, and trivalent Al and Ga;
C=one or more selected from the group consisting of monovalent Li and Cu;
B=one or more selected from the group consisting of divalent Mg, Zn, Mn and Cd;
A=one or more selected from the group consisting of tetravalent Si, Ge, Ti, and Hf;
Ln=one or more selected from the group consisting of ES and RE;
ES=one or more selected from the group consisting of divalent Eu, Sm and Yb;
RE=one or more selected from the group consisting of trivalent Ce, Pr, Nd, Sm, Eu, Gd, Tb, Dy, Ho, Er, and Tm; and
 wherein $0 \leq b \leq 1$; and
heating the starting materials at a temperature in a range of about 800° C. to about 1300° C.

14. The method of claim 13, wherein Ln comprises one or more of Eu and Ce, and wherein the heating is performed in a reducing atmosphere.

15. A backlighting unit of an LCD display device comprising the lighting unit of claim 1.

16. A projection system comprising the lighting unit of claim 1.

17. A self-lit display system comprising the lighting unit of claim 1.

18. A pixelated display system comprising the lighting unit of claim 1.

19. A segmented display system comprising the lighting unit of claim 1.

20. A medical lighting system comprising the lighting unit of claim 1.

* * * * *